US010712156B2

(12) United States Patent
Takayama et al.

(10) Patent No.: US 10,712,156 B2
(45) Date of Patent: Jul. 14, 2020

(54) STRUCTURE USING FERROELECTRIC FILM AND SENSOR USING SAID STRUCTURE

(71) Applicant: Panasonic Intellectual Property Management Co., Ltd., Osaka (JP)

(72) Inventors: Ryouichi Takayama, Osaka (JP); Hideaki Adachi, Osaka (JP); Takakiyo Harigai, Kyoto (JP); Yoshiaki Tanaka, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 161 days.

(21) Appl. No.: 16/084,813

(22) PCT Filed: Mar. 16, 2017

(86) PCT No.: PCT/JP2017/010569

§ 371 (c)(1),
(2) Date: Sep. 13, 2018

(87) PCT Pub. No.: WO2017/164051

PCT Pub. Date: Sep. 28, 2017

(65) Prior Publication Data

US 2019/0072387 A1 Mar. 7, 2019

(30) Foreign Application Priority Data

Mar. 22, 2016 (JP) ................................ 2016-056460
Mar. 22, 2016 (JP) ................................ 2016-056461
(Continued)

(51) Int. Cl.
*G01C 19/56* (2012.01)
*G01C 19/5628* (2012.01)
(Continued)

(52) U.S. Cl.
CPC ........... *G01C 19/5628* (2013.01); *G01J 1/02* (2013.01); *H01L 37/02* (2013.01); *H01L 37/025* (2013.01);
(Continued)

(58) Field of Classification Search
CPC ... G01C 19/5628; H01L 37/02; H01L 37/025; H01L 41/047; H01L 41/0815; H01L 41/113; H01L 41/1876; H01L 41/319
See application file for complete search history.

(56) References Cited

U.S. PATENT DOCUMENTS

2010/0244632 A1 9/2010 Maekawa et al.

FOREIGN PATENT DOCUMENTS

JP 2010-238856 10/2010
JP 2014-006078 1/2014

OTHER PUBLICATIONS

International Search Report of PCT application No. PCT/JP2017/010569 dated May 30, 2017.

*Primary Examiner* — Matthew L Reames
(74) *Attorney, Agent, or Firm* — McDermott Will & Emery LLP

(57) ABSTRACT

Provided are a structure including: a substrate; a first layer provided on the substrate; a second layer provided on the first layer; and a third layer provided on the second layer, in which the first layer is a layer containing a compound represented by a chemical formula $MIn_2O_4$ using M as a metal element, the second layer is a metal layer having a face-centered cubic structure, and the third layer is a ferroelectric film, and a sensor using the structure.

17 Claims, 8 Drawing Sheets

10
31
20
32
40
50

(30) Foreign Application Priority Data

Apr. 27, 2016 (JP) ................................ 2016-088774
Apr. 27, 2016 (JP) ................................ 2016-088775

(51) Int. Cl.

| | |
|---|---|
| ***G01J 1/02*** | (2006.01) |
| ***H01L 37/02*** | (2006.01) |
| ***H01L 41/08*** | (2006.01) |
| ***H01L 41/187*** | (2006.01) |
| ***H01L 41/047*** | (2006.01) |
| ***H01L 41/113*** | (2006.01) |
| ***H01L 41/319*** | (2013.01) |

(52) U.S. Cl.

CPC ........ *H01L 41/047* (2013.01); *H01L 41/0815* (2013.01); *H01L 41/113* (2013.01); *H01L 41/1876* (2013.01); *H01L 41/319* (2013.01); *H01L 41/1132* (2013.01)

STRUCTURE USING FERROELECTRIC FILM AND SENSOR USING SAID STRUCTURE

CROSS-REFERENCE TO RELATED APPLICATIONS

This application is a U.S. national stage application of the PCT International Application No. PCT/JP2017/010569 filed on Mar. 16, 2017, which claims the benefit of foreign priority of Japanese patent applications 2016-056460 filed on Mar. 22, 2016, 2016-056461 on Mar. 22, 2016, 2016-088774 on Apr. 27, 2016 and 2016-088775 filed on Apr. 27, 2016, the contents all of which are incorporated herein by reference.

FIELD OF THE INVENTION

The present invention relates to a structure using a ferroelectric film that is used for a sensor or the like.

DESCRIPTION OF THE RELATED ART

A structure has heretofore been known including a silicon substrate, a buffer layer of a zirconium oxide ($ZrO_2$) film provided on the silicon substrate, a lower electrode of a platinum (Pt) film used for controlling crystalline orientation of a piezoelectric film provided on the buffer layer, and a lead zirconate titanate (PZT) film epitaxially grown on the lower electrode. A sensor using the structure has also been known.

As a prior art document related to the invention of this application, for example, PTL 1 is known.

CITATION LIST

Patent Literature

PTL 1: Unexamined Japanese Patent Publication No. 2010-238856

PTL 2: Unexamined Japanese Patent Publication No. 2014-6078

SUMMARY OF THE INVENTION

An object of the present invention is to provide a structure using a ferroelectric film with improved mass productivity.

To solve the above-mentioned object, a structure according to the present invention includes a substrate, a first layer provided on the substrate, a second layer provided on the first layer, and a third layer provided on the second layer. The first layer is a layer containing a compound represented by a chemical formula $MIn_2O_4$ using M as a metal element. The second layer is a metal layer having a face-centered cubic structure. The third layer is a ferroelectric film.

A structure using a ferroelectric film according to the present invention and a sensor using the structure provide an advantageous effect that the mass productivity can be improved.

DETAILED DESCRIPTION OF THE PREFERRED EMBODIMENTS

Prior to description of an exemplary embodiment of the present invention, problems inherent in conventional structures will be briefly described. If a metal film, such as a zirconium oxide ($ZrO_2$), is used as a buffer layer, conditions, such as a temperature at which orientation control during formation of a platinum (Pt) film required for controlling crystalline orientation of a piezoelectric film provided on the buffer layer is applied, are extremely severe, which is not suitable for mass production.

A piezoelectric element (structure) according to an exemplary embodiment of the present invention and a sensor using the piezoelectric element will be described below with reference to the drawings.

Figure 1:
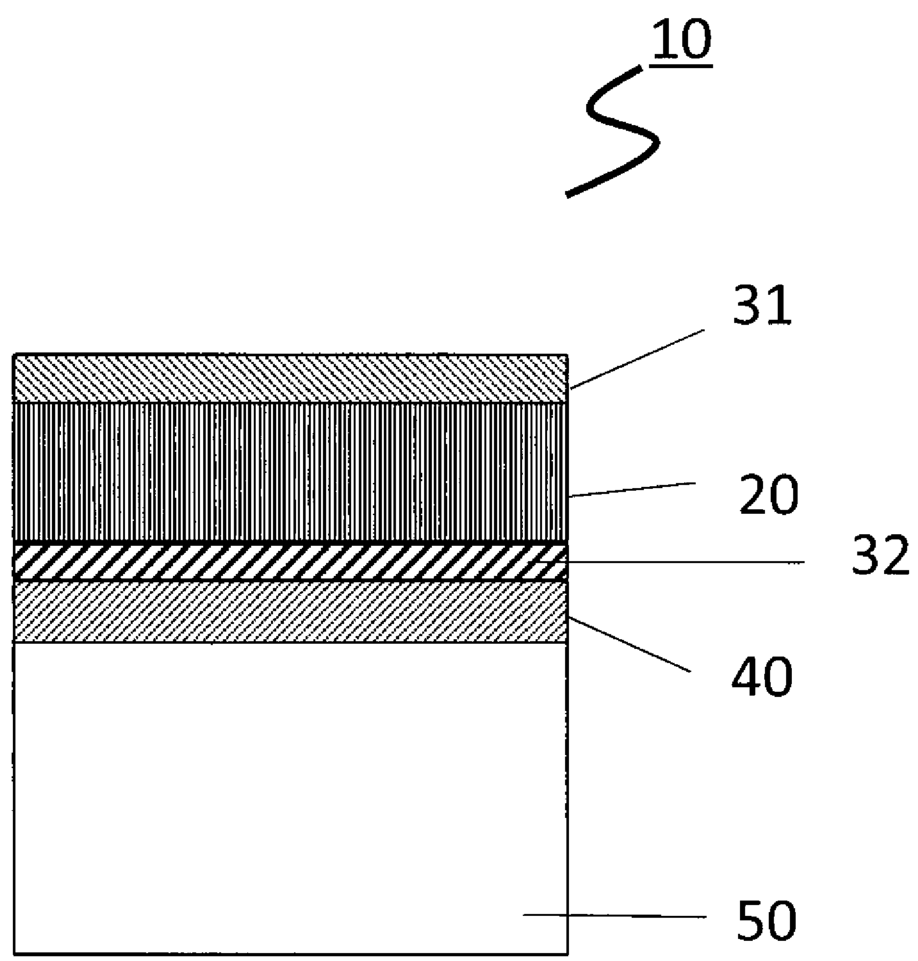
FIG. 1 is a sectional view of a structure using a ferroelectric film according to an exemplary embodiment of the present invention.

FIG. 1 is a sectional view of a structure using a ferroelectric film according to the present exemplary embodiment.

In FIG. 1, structure 10 using a ferroelectric film includes substrate 50, intermediate thin film 40, lower electrode 32, ferroelectric film 20, and upper electrode 31. Note that intermediate thin film 40, lower electrode 32, and ferroelectric film 20 may also be referred to as a first layer, a second layer, and a third layer, respectively.

Ferroelectric film 20 is, for example, a perovskite-type composite oxide represented by a chemical formula $ABO_3$. In this formula, A and B represent cations. One or more elements selected from the group consisting of Ca, Ba, Sr, Pb, K, Na, Li, La, and Cd are preferably used as A, and one or more elements selected from the group consisting of Ti, Zr, Ta, and Nb are preferably used as B. Specifically, as a material for ferroelectric film 20, lead zirconate titanate (PZT), lead-magnesium niobate-PZT based (PMN-PZT), lead nickel niobate-PZT based (PNN-PZT), lead-magnesium niobate-lead titanate based (PMN-PT), lead nickel niobate-PT based (PNN-PT), bismuth sodium titanate-barium titanate based (NBT-BT based), barium strontium titanate based (BST), or the like are preferably used.

Note that as ferroelectric film 20, a laminate film formed by stacking the above-described films may be used.

As substrate 50, for example, a (001)-oriented MgO monocrystalline substrate, a (001)-oriented yttria-stabilized zirconia (YSZ) monocrystalline substrate, or a silicon monocrystalline substrate having a (001)-oriented YSZ epitaxial film formed on a surface of the substrate is used.

Intermediate thin film 40 is provided on substrate 50. As intermediate thin film 40, an oxide composed of a compound represented by a chemical formula $MIn_2O_4$ (M is a metal element). As M, for example, magnesium (Mg), zinc (Zn), or cadmium (Cd) is used. Intermediate thin film 40 is provided to thereby control the orientation of lower electrode 32 provided on the intermediate thin film.

Lower electrode 32 is a metal having a face-centered cubic structure, such as platinum (Pt), gold (Au), iridium (Ir), palladium (Pd), or an alloy or laminated structure of these elements. Lower electrode 32 is provided to thereby control the orientation of ferroelectric film 20 provided on lower electrode 32.

Ferroelectric film 20 is a film oriented in a c-axis direction. However, the crystal structure need not necessarily be a film having a complete (001) orientation. The crystal structure may be a thin film having a structure in which c-axis oriented crystal ((001)-oriented crystal) and a-axis oriented crystal ((100)-oriented crystal) are moderately mixed so that crystal grains can be ideally close-packed on lower electrode 32.

Upper electrode 31 is a metal film and is, for example, platinum (Pt), gold (Au), copper (Cu), titanium (Ti), aluminum (Al), or an alloy or laminated structure of these elements.

Preferably, $MgIn_2O_4$ is used as intermediate thin film 40. According to experiments conducted by the present inventor, it has been proved that a (002)-oriented epitaxial film can be easily obtained using $MgIn_2O_4$ at a temperature in a range from 300° C. to 700° C., inclusive. In other words, there is no need to adjust the temperature during formation of the $MgIn_2O_4$ film, or before and after the formation. Also, there is no need to adjust an $O_2$ partial pressure during formation of the $MgIn_2O_4$ film. In other words, it has been proved by experiments that $MgIn_2O_4$ film can be formed without the need for special control, and thus the $MgIn_2O_4$ film is excellent in mass productivity.

Further, preferably, platinum (Pt) is used as lower electrode 32. According to experiments, it has been proved that Pt is formed on an $MgIn_2O_4$ (002)-oriented epitaxial film, thereby obtaining a Pt (002)-oriented epitaxial film without the need for special control.

Incidentally, an "epitaxial film" can also be referred to as a film which is single-axis oriented in the normal direction and biaxially oriented within the plane. Accordingly, X-ray diffraction can be used to verify whether the film is an epitaxial film. Specifically, first, 2θ-θ scanning is carried out to confirm whether the film is single-axis oriented in the normal direction. Next, the symmetry of crystal is confirmed to thereby confirm whether the film is biaxially oriented within the plane. As a result, it can be confirmed whether the film is an epitaxial film. For example, in the case of a film epitaxially oriented in a [002] direction, first, 2θ-θ scanning is performed to confirm that the film is oriented outside of the plane in the (002) direction. Next, the positional relationship of 2θ-θ of an X-ray diffraction device with respect to a crystal face is fixed so as to detect a (202) plane, and the substrate is tilted by 45° from the normal direction, and then the X-ray diffraction is measured while the substrate is rotated in a plane by 360 degrees. At this time, if it can be confirmed that four peaks respectively corresponding to four planes equivalent to the (202) plane appear at intervals of 90 degrees, it can be determined that the film is an epitaxial film. At this time, in 2θ-θ scanning, not only peaks corresponding to main axes, but also peaks related to other axes may be confirmed, or when the symmetry within the plane is confirmed, some peaks (hereinafter referred to "other peaks" other than the four periodic peaks may be confirmed. However, if the intensity of other peaks is equal to or less than 1/10 of the main peak intensity, the film may be determined to be an epitaxial film.

Further, in the case of the present exemplary embodiment, it is considered that the (101) plane and (202) plane and the [001] direction and [002] direction indicate parallel planes having different degrees and also indicate equivalent directions and planes.

Figure 2:
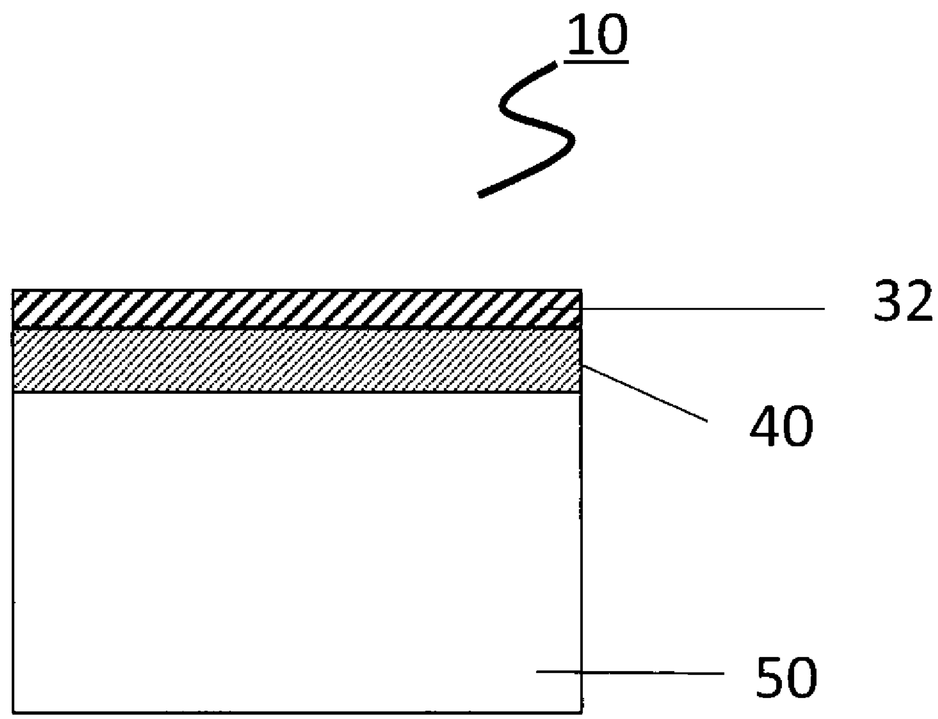
FIG. 2 is another sectional view of the structure.
Figure 3:
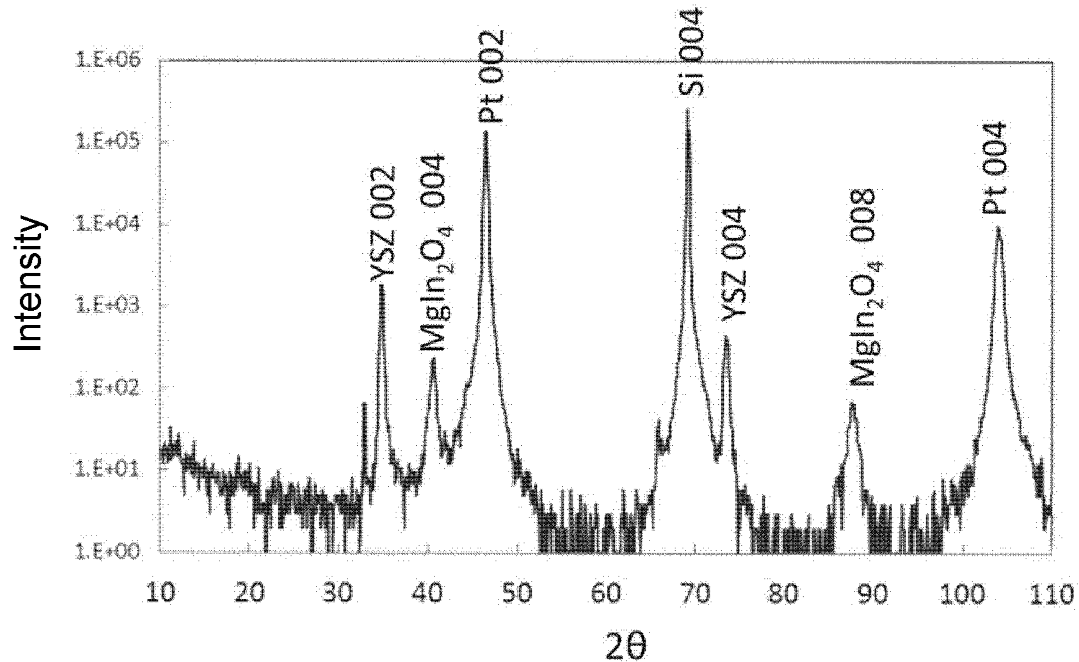
FIG. 3 is a characteristic diagram illustrating a result of X-ray diffraction.

FIG. 3 is a characteristic diagram illustrating a result of 2θ-θ scanning performed on the structure including substrate 50, intermediate thin film 40, and lower electrode 32 as illustrated in FIG. 2. In this case, as substrate 50, a (001)-oriented YSZ epitaxial film is used as the silicon monocrystalline substrate formed on the surface, an $MgIn_2O_4$ film is used as intermediate thin film 40, and a Pt film is used as lower electrode 32.

Figure 4:
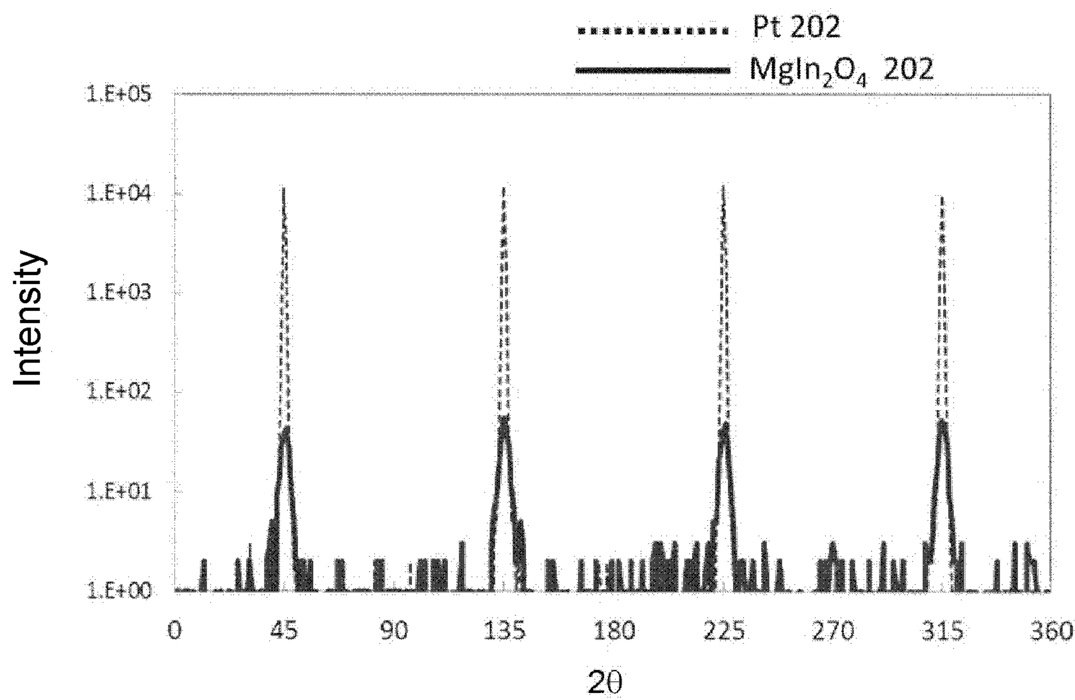
FIG. 4 is another characteristic diagram illustrating a result of X-ray diffraction.

FIG. 4 is a characteristic diagram illustrating a result of X-ray diffraction in which the positional relationship of 2θ-θ of the X-ray diffraction device with respect to a crystal face is fixed so as to detect the (202) plane of each of the $MgIn_2O_4$ film and the Pt film, and substrate 50 was tilted by 45° from the normal direction, and then the X-ray diffraction was measured while the substrate was rotated in a plane by 360 degrees.

In the formation of the $MgIn_2O_4$ film, the film was prepared by RF magnetron sputtering. In this case, the substrate temperature was heated to 400 degrees and an oxygen gas and an argon gas were mixed at a ratio of 1:1 and introduced. Then, the pressure was adjusted to 4 Pa and sputtering was carried out at a power of 80 W. The Pt film was also formed by magnetron sputtering in the state of 400° C.

In FIG. 3, the YSZ (002) peak and higher-order (004) peak of the substrate, as well as the (004) and higher-order (008) peaks of the $MgIn_2O_4$ film formed on the substrate can be confirmed. Thus, it can be confirmed that the $MgIn_2O_4$ film is oriented in the (002) direction outside of the plane of substrate 50. Further, the (002) and higher-order (004) peaks of the Pt film can also be confirmed. Thus, it can be confirmed that the film is oriented in the (002) direction outside of the plane of the substrate.

It can be confirmed from FIG. 4 that the $MgIn_2O_4$ film and the Pt film each have four peaks every 90° at the same location. Thus, it can be confirmed that the films are biaxially oriented within the plane. In other words, it can be confirmed that the $MgIn_2O_4$ film and the Pt film are (002)-oriented epitaxial films.

Figure 5:
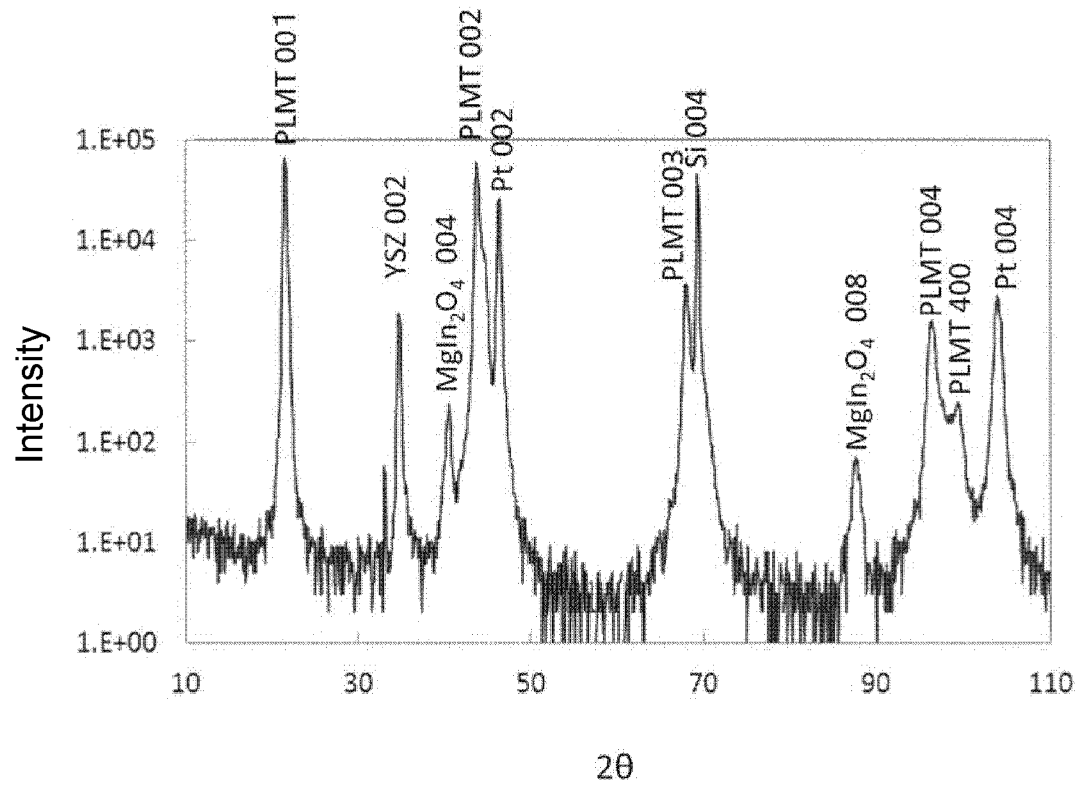
FIG. 5 is still another characteristic diagram illustrating a result of X-ray diffraction.

FIG. 5 illustrates a result of measurement of X-ray diffraction (2θ-θ) on the structure in which niobium-added lead lanthanum titanate (PLMT) obtained by replacing Pb which is a part of the lead titanate ($PbTiO_3$) serving as ferroelectric film 20 with lanthanum (La) and adding niobium was formed on the structure illustrated in FIG. 3. From this figure, it can be confirmed that ferroelectric film 20 formed on the structure illustrated in FIG. 3 is strongly oriented in the (001) direction.

Next, gyro sensor 100 according to an exemplary embodiment of the present invention will be described.

Figure 6:
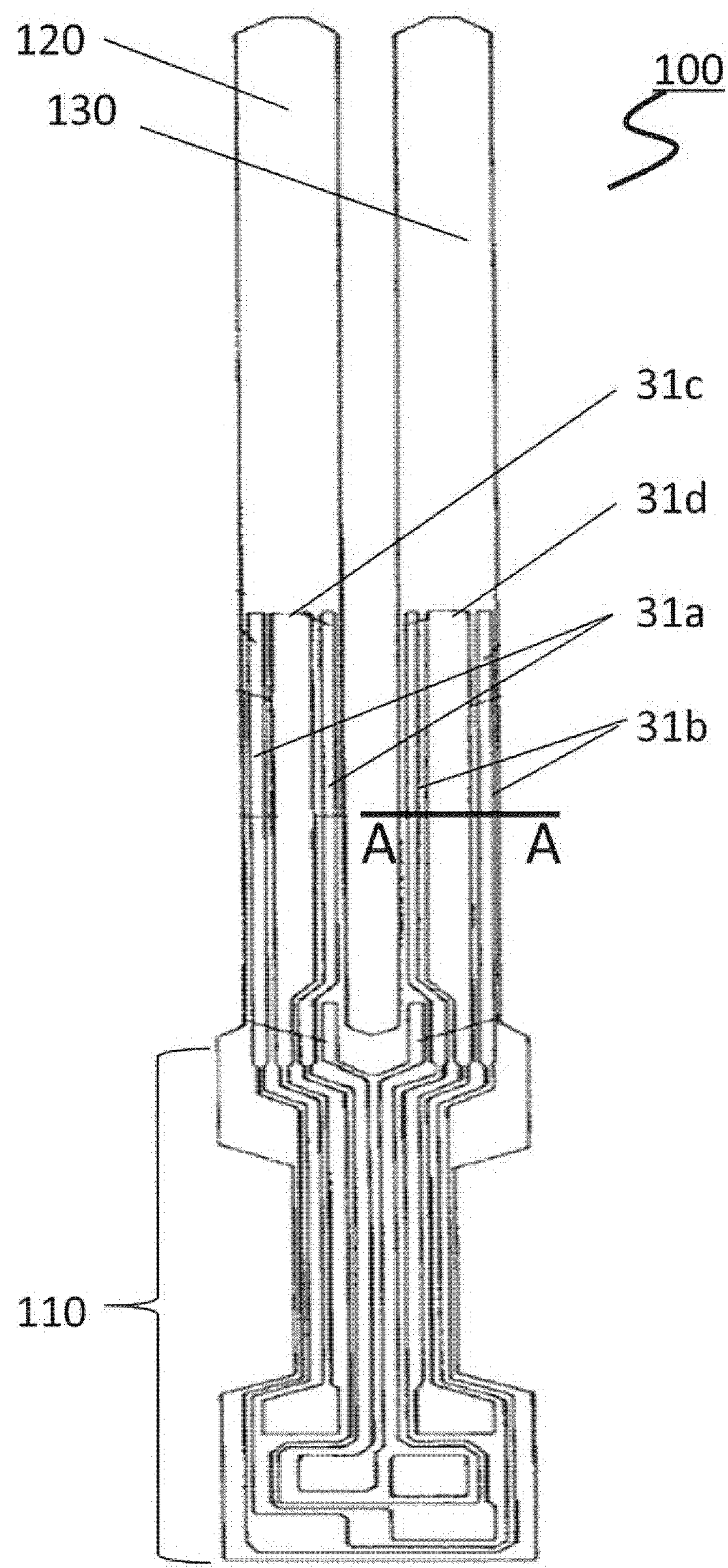
FIG. 6 is a plan view of a gyro sensor according to an exemplary embodiment of the present invention.
Figure 7:
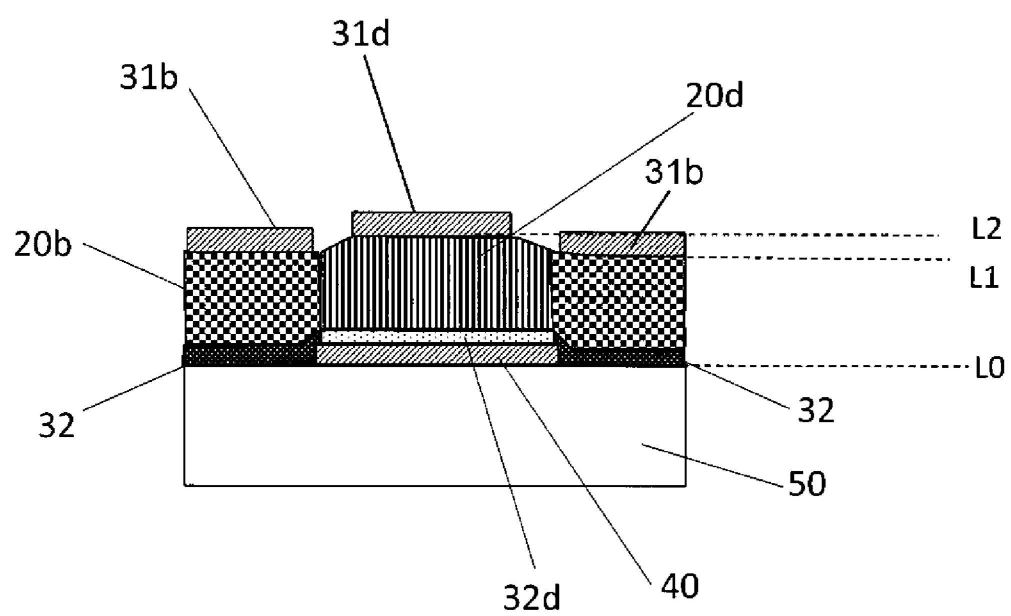
FIG. 7 is a sectional view taken along line A-A of FIG. 6.

FIG. 6 is a plan view of gyro sensor 100. FIG. 7 is a sectional view taken along line A-A of FIG. 6.

Intermediate thin film 40 is provided, so that lower electrode **32*d* located below detection electrodes 31*c*, 31*d*, and a ferroelectric film provided above lower electrode 32*d* serve as a (001)-oriented epitaxial film (in other words, epitaxial ferroelectric film 20*d***).

Gyro sensor 100 includes base 110 and two arms 120, 130 which are connected to one surface of base 110. Gyro sensor 100 is obtained by processing ferroelectric film 20, upper electrode 31, and lower electrode 32, which constitute structure 10 using the ferroelectric film described above, into the shape of a fork oscillator. The parts (base 110 and arms 120, 130) of gyro sensor 100 are integrally formed by structure 10 using the ferroelectric film. On a first principal surface of arm 120, driving electrode 31*a* and detection electrode 31*c* are formed. Similarly, driving electrode 31*b* and detection electrode 31*d* are formed on a first principal surface of arm 130. These electrodes are obtained by etching upper electrode 31 into a predetermined electrode shape. Note that lower electrode 32*d* formed on a second principal surface (a principal surface opposite to the first principal surface) of each of base 110 and arms 120, 130 functions as a ground electrode of gyro sensor 100.

FIG. 7 is a sectional view taken along line A-A of FIG. 6. In gyro sensor 100, PZT (which can also be referred to as a PZT film of a detected portion) formed below detection electrode 31*d* serves as an epitaxial film (epitaxial ferroelectric film 20*d*), and a PZT film (which can also be referred to as a PZT film of a driven portion) of driving electrode 31*b* serves as an oriented ferroelectric film (in other words, orientation ferroelectric film 20*b*).

Note that the sensor to which the invention in which PZT of the detected portion serves as a ferroelectric film (epitaxial ferroelectric film 20*d*) of an epitaxial film and the film of the driven portion serves as oriented ferroelectric film 20 (oriented ferroelectric film 20*b*) can be applied is not limited to an angular velocity sensor. For example, the present invention can also be applied to an oscillation type acceleration sensor and a pyroelectric sensor.

Figure 8:
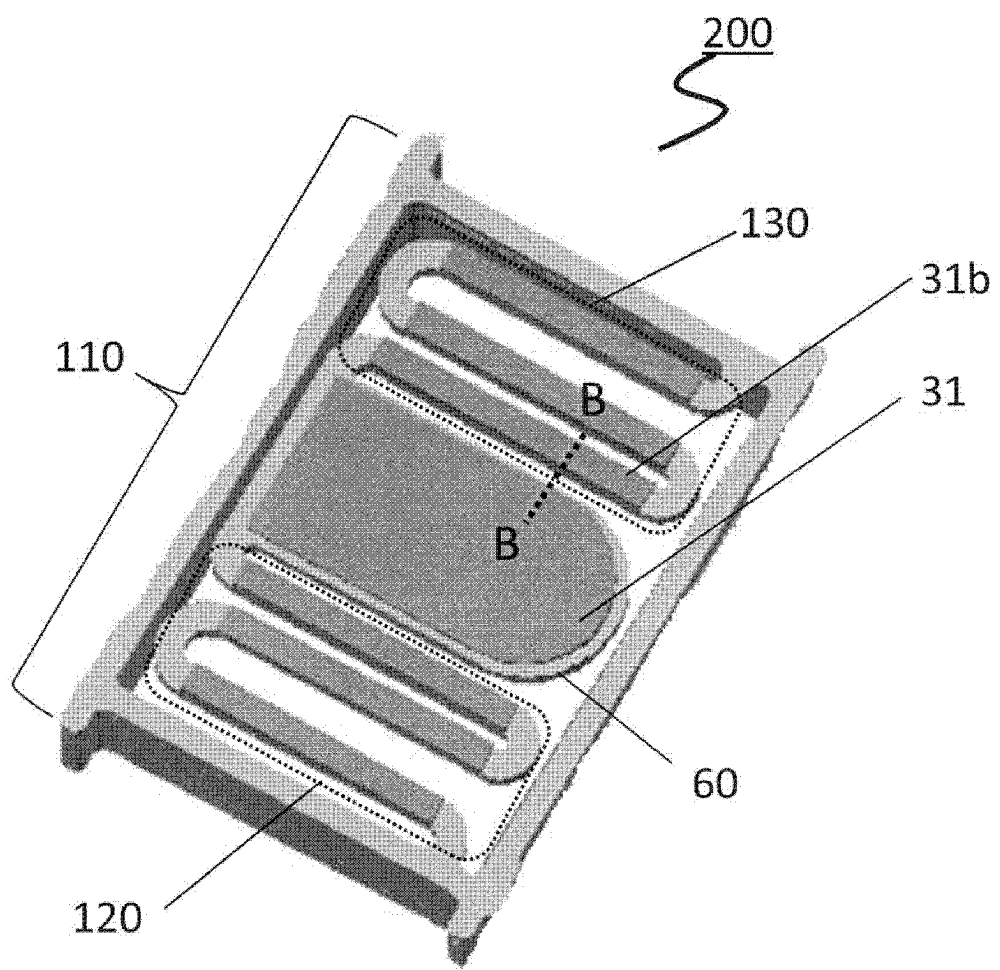
FIG. 8 is a plan view of a pyroelectric sensor according to an exemplary embodiment of the present invention.
Figure 9:
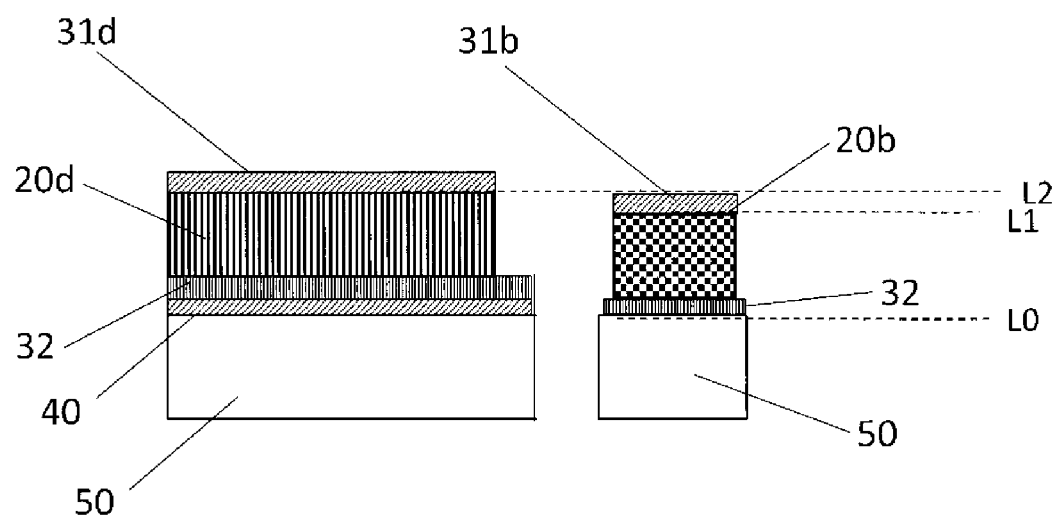
FIG. 9 is a sectional view taken along line B-B of FIG. 8.

FIG. 8 is a plan view of pyroelectric sensor 200 according to an exemplary embodiment of the present invention. FIG. 9 is a sectional view taken along line B-B of FIG. 8. Pyroelectric sensor 200 includes base 110, two arms 120, 130 each connected to one surface of base 110, and movable part 60 connected to each of arms 120, 130. A voltage is applied to driving electrode 31*a* to oscillate movable part 60, and the ferroelectric film (epitaxial ferroelectric film 20*d*) located below detection electrode 31*d* provided in movable part 60 is scanned to thereby enable detection of infrared light or the like. Pyroelectric sensor 200 can also be referred to as scanning type pyroelectric sensor 200. As such a pyroelectric sensor, for example, a sensor disclosed in PTL 2 is known.

As described above, the configuration of the film of the detected portion is different from that of the film of the driven portion. Consequently, the accuracy of the sensor can be improved.

Note that in any of the sensors, advantageous effects can be obtained only by providing the structure in which PZT of the detected portion serves as the epitaxial film (epitaxial ferroelectric film 20*d*) and the film of the driven portion serves as the oriented ferroelectric film (oriented ferroelectric film 20*b*). Accordingly, the epitaxial film (epitaxial ferroelectric film 20*d*) of the detected portion is not limited to the configuration illustrated in FIG. 1.

Note that features of the sensor (gyro sensor 100, pyroelectric sensor 200, etc.) using structure 10 using the ferroelectric film according to the present exemplary embodiment can be described as follows.

The sensor includes substrate 50, lower electrode 32 provided on substrate 50, ferroelectric film 20 provided on lower electrode 32, and upper electrode 31 provided on ferroelectric film 20. In this case, upper electrode 31 includes driving electrodes 31*a*, 31*b* and detection electrodes 31*c*, 31*d*. Further, a distance from substrate 50 to driving electrodes 31*a*, 31*b* (a distance between L0 and L1 illustrated in FIGS. 7 and 9) is smaller than a distance from substrate 50 to detection electrodes 31*c*, 31*d* (a distance between L0 and L2 illustrated in FIGS. 7 and 9).

Note that "structure 10 using a ferroelectric film, including substrate 50, intermediate thin film 40, lower electrode 32, ferroelectric film 20, and upper electrode 31" has been described above, but the present invention is not limited to this. The functions of each film can be enhanced by using a functional film (e.g., a film having such characteristics as an ion conduction film, a thermoelectric conversion film, a magnetic film, and a semiconductor film) instead of a ferroelectric film. Further, the invention according to the present exemplary embodiment can also serve as "a structure including substrate 50, intermediate thin film 40, and lower electrode 32". This structure can be used for, for example, catalyst using the orientation of lower electrode 32.

A structure using a ferroelectric film according to the present invention, and a sensor using the structure are excellent in mass production, and thus are useful for electronic devices and for vehicle control.

The invention claimed is:

1. A structure comprising:

a substrate;

a first layer provided on the substrate;

a second layer provided on the first layer; and a third layer provided on the second layer, wherein the first layer is a layer containing a compound represented by a chemical formula $MIn_2O_4$ using M as a metal element, the second layer is a metal layer having a face-centered cubic structure, and the third layer is a ferroelectric film.

2. The structure according to claim 1, wherein the first layer and the second layer are epitaxially grown with a (002) orientation.

3. The structure according to claim 1, wherein the first layer is an epitaxial film with a (002) orientation.

4. The structure according to claim 1, wherein the second layer is an epitaxial film with a (002) orientation.

5. The structure according to claim 1, wherein the second layer contains any one of Ir, Au, Pt, and Pd.

6. The structure according to claim 1, wherein the M contains any one of Mg, Zn, and Cd.

7. The structure according to claim 1, wherein the third layer is a perovskite-type composite oxide represented by a chemical formula $ABO_3$ with A and B as cations.

8. The structure according to claim 1, wherein the third layer comprises lead zirconate titanate.

9. A sensor comprising the structure according to claim 1, the sensor being configured to detect an angular velocity.

10. A sensor comprising the structure according to claim 1, the sensor being configured to detect infrared light.

11. A structure comprising:

a substrate;

a first layer provided on the substrate;

a second layer provided on the first layer; and a third layer provided on the second layer, wherein the first layer is a layer containing a compound represented by a chemical formula $MIn_2O_4$ using M as a metal element, the second layer is a metal layer containing Pt, and the first layer and the second layer each include four peaks substantially at an identical location every 90° in an X-ray diffraction.

12. The structure according to claim 11, wherein the M is Mg, and the first layer and the second layer are (002)-oriented epitaxial films.

13. The structure according to claim 11, wherein the third layer is a ferroelectric film.

14. The structure according to claim 11, wherein the second layer contains any one of Ir, Au, Pt, and Pd.

15. The structure according to claim 11, wherein the M contains any one of Mg, Zn, and Cd.

16. The structure according to claim 11, wherein the third layer is a perovskite-type composite oxide represented by a chemical formula $ABO_3$ with A and B as cations.

17. The structure according to claim 11, wherein the third layer is lead zirconate titanate.

* * * * *